United States Patent
Lee et al.

(10) Patent No.: US 6,875,670 B2
(45) Date of Patent: Apr. 5, 2005

(54) TRENCH ISOLATION METHOD

(75) Inventors: Han-Sin Lee, Suwon (KR); Moon-Han Park, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/775,231

(22) Filed: Feb. 1, 2001

(65) Prior Publication Data
US 2002/0004281 A1 Jan. 10, 2002

(30) Foreign Application Priority Data
Jul. 10, 2000 (KR) .......................................... 2000-39317

(51) Int. Cl.⁷ .......................... H01L 21/76; H01L 21/31; H01L 21/469
(52) U.S. Cl. ....................... 438/435; 438/427; 438/424; 438/788
(58) Field of Search ................................. 438/435, 437, 438/424, 788

(56) References Cited

U.S. PATENT DOCUMENTS

| | | | |
|---|---|---|---|
| 6,037,237 A | 3/2000 | Park et al. | .................. 438/424 |
| 6,184,077 B1 * | 2/2001 | Shin et al. | |
| 6,255,194 B1 * | 7/2001 | Hong | .......................... 438/435 |
| 6,319,796 B1 * | 11/2001 | Laparra et al. | ............. 438/435 |
| 6,326,282 B1 * | 12/2001 | Park et al. | .................. 438/424 |

* cited by examiner

Primary Examiner—John F. Niebling
Assistant Examiner—Ron Pompey
(74) Attorney, Agent, or Firm—Mills & Onello LLP

(57) ABSTRACT

In a trench isolation method, an etching mask pattern for forming a trench is formed on a semiconductor substrate. The substrate is etched to form a trench. An insulating layer is formed to fill the trench, and then a material layer is formed on the insulating layer. In this case, the material layer is made of material formed at a high temperature to density the insulating layer. The material layer and the insulating layer are planarly etched and the etching mask pattern is removed, so that a trench isolation layer is completed. Accordingly, although a densification process is avoided, it is possible to form a device isolation layer having a favorable surface profile.

12 Claims, 6 Drawing Sheets

TRENCH ISOLATION METHOD

This application relies for priority upon Korean Patent Application No. 2000-39317, filed on Jul. 10, 2000, the contents of which are herein incorporated by reference in their entirety.

FIELD OF THE INVENTION

The present invention relates to a method of manufacturing a semiconductor device and, more particularly, to a trench isolation method for manufacture of a semiconductor device.

BACKGROUND OF THE INVENTION

A device isolation layer is formed on a semiconductor substrate in order to define active regions and electrically isolate the active regions from each other. As a method of forming the device isolation layer, local oxidation of silicon (LOCOS) technique and trench isolation technique are commonly utilized. Since a semiconductor substrate is locally subject to thermal oxidation to form a field oxide layer, LOCOS is a relatively simple process. As the integration level of semiconductor devices increases, an abnormal feature on the oxide layer referred to as a "bird's beak" or poor planarity caused by the LOCOS process have become serious problems. Accordingly, the trench isolation technique has widely been utilized.

In the trench isolation technique, an etching mask for a trench is formed on a semiconductor substrate. Using the etching mask, the semiconductor substrate is etched to form a trench, which is then filled with an insulating layer. In the following wet etching process, the insulating layer is etched, which could cause a deterioration of the characteristics of the device isolation layer. Accordingly, the insulating layer is densified for preventing the deterioration. The densification is carried out by annealing the insulating layer in oxygen ambient at a temperature of 900° C.~1200° C. for an hour.

Since the densification is carried out at a high temperature, this changes the volumes an insulating layer formed in a trench and a semiconductor substrate vary. The thermal expansion ratio of the insulating layer is different from that of the semiconductor substrate, so that stress is applied to the trench inner wall that serves as an interface therebetween.

U.S. Pat. No. 6,037,237 discloses a method of forming an insulating layer composed of stacked layers whose stress characteristics are different from each other when the insulating layer is formed to fill a trench. According to this approach, an insulating layer having a compressive stress characteristic, and an insulating layer having a tensile stress characteristic, for example, a USG (undoped silicate glass) layer and a PTEOS (plasma tetraethylorthosilicate) layer, or an HDP (high density plasma) layer and the PTEOS layer, are stacked to reduce stress applied to the semiconductor substrate during the densification. An upper insulating layer is made of an insulator of favorable planarization characteristic, easily carrying out the following planarization etching process.

Although the insulating layer of a stack structure is formed for reducing the stress, the following densification still puts a burden on the overall process. That is, stress created in the high thermal annealing process cannot entirely be removed, and therefore causes a declination in productivity.

SUMMARY OF THE INVENTION

Therefore, it is an object of the present invention to provide a trench isolation method which avoids the need for a densification process for densifying the insulating layer formed in the trench.

According to an aspect of the present invention, a pad oxide layer and etch-stop layer are sequentially formed on a semiconductor substrate. With a patterning process, the etch-stop layer and the pad oxide layer are sequentially etched to form an etching mask pattern that exposes a predetermined region of the semiconductor substrate. Using the etching mask pattern as an etching mask, the exposed semiconductor substrate is etched to form a trench. An oxide layer is formed on an inner wall and a bottom of the trench, and then an oxidation barrier layer is formed on the oxide layer. An insulating layer to fill the trench is formed on an overall surface of the above resulting structure where the oxidation barrier layer is formed. Using a layer formed at a high temperature, a material layer is formed on the insulating layer. During formation of the material layer, the insulating layer is densified. The material layer is made of one selected from a group consisting of, for example, HTO (high temperature oxide), high temperature USG (undoped silicate glass), polysilicon, and amorphous silicon that are formed at a temperature of 500° C. and higher. The material layer and the insulating layer are planarly etched down to a top surface of the etching mask pattern, so that a device isolation layer is formed. Then, the exposed etching mask pattern is removed to form a trench isolation layer.

BRIEF DESCRIPTION OF THE DRAWINGS

A further understanding of the nature and advantage of the invention herein may be realized by reference to the remaining portions of the specification and the attached drawings.

DETAILED DESCRIPTION OF PREFERRED EMBODIMENTS

Figure 1A:
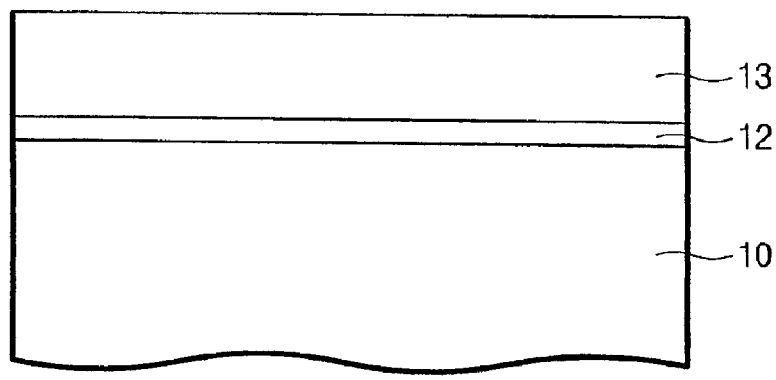
FIG. 1A through FIG. 1H are cross-sectional views for description of a trench isolation method in accordance with the present invention.

Referring to FIG. 1A, a pad oxide layer 12 is formed on an overall surface of a semiconductor substrate 10. An etch-stop layer 13 is formed on the pad oxide layer 12. The pad oxide layer 12 serves as a buffer layer for reducing stress applied to the substrate 10, and the etch-stop layer 13 is used as an etching mask in the following process for forming a trench. The pad oxide layer 12 is comprised of, for example, thermal oxide, having a thickness of 20 Å~200 Å. The etch-stop layer 13 comprises, for example, silicon nitride or polysilicon. If the etch-stop layer 13 is made of polysilicon, it is preferable that an HTO layer (not shown) is additionally formed on the polysilicon layer. This additional layer removed the need for etching the polysilicon layer in the following process for forming a trench.

Figure 1B:
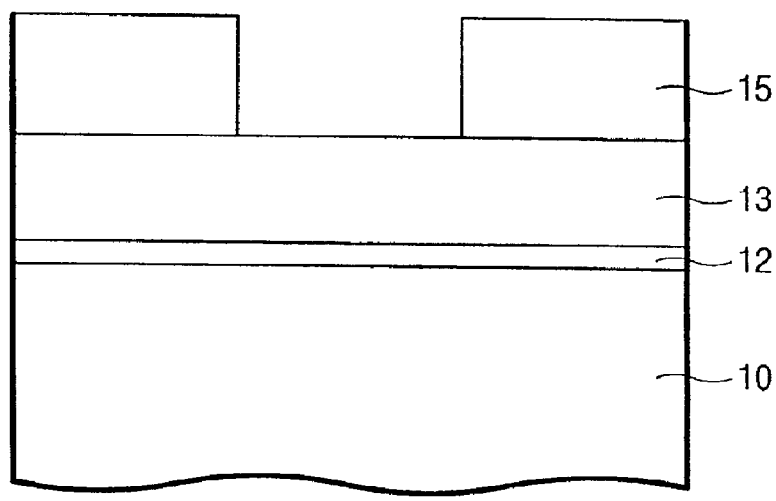
Figure 1C:
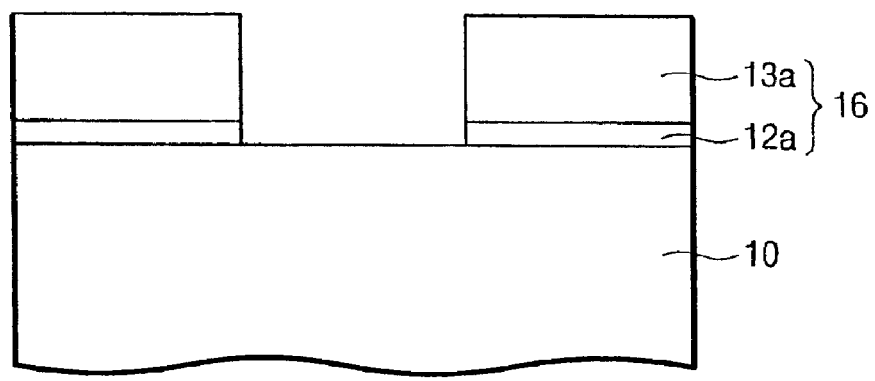

Referring to FIG. 1B and FIG. 1C, a photoresist layer is formed on the etch-stop layer 13. The photoresist layer is patterned to form a photoresist pattern 15 to define a trench region. Using the photoresist pattern 15 as an etching mask, the etch-stop layer 13 and the pad oxide layer are sequentially etched to expose a predetermined region of the substrate 10. An etching mask pattern is then formed, which is composed of a pad oxide layer pattern 12a and an etch-stop layer pattern 13a stacked sequentially. With $O_2$ plasma ashing, the photoresist pattern 15 is removed.

Figure 1D:
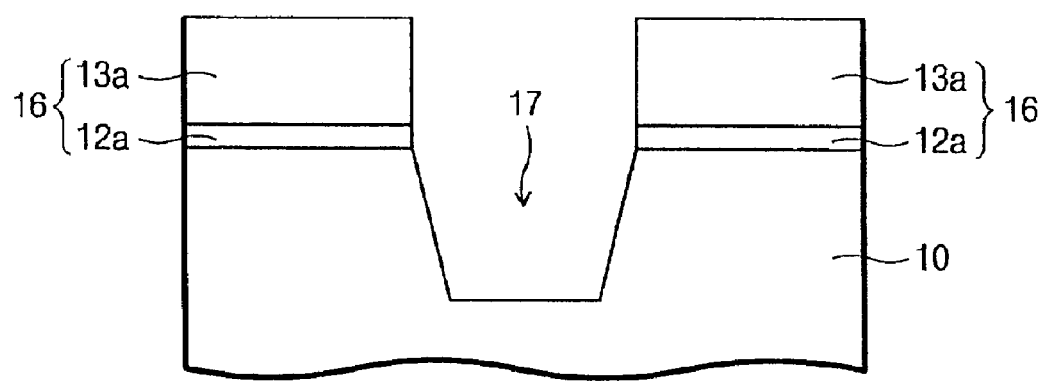
Figure 1E:
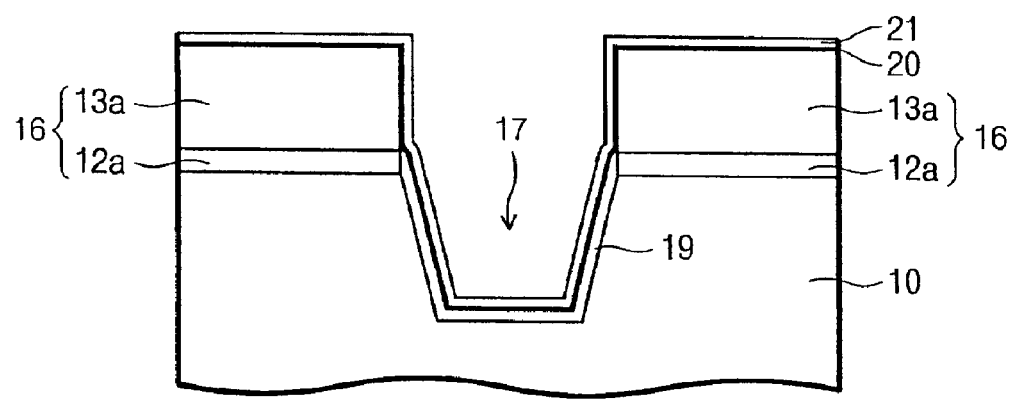

Referring to FIG. 1D and FIG. 1E, using the etching mask pattern 16 as an etching mask, the exposed substrate 10 is dry etched to form a trench 17. In order to cure etching damage applied to the substrate 10 in forming the trench 17, an oxide layer 19 is formed on an inner wall and a bottom of the trench 17. The oxide layer 19 is made of, for example, thermal oxide or chemical vapor deposition (CVD) oxide with a thickness of 20 Å~200 Å. If the CVD oxide layer is formed, an annealing process is then carried out.

In order to prevent the inner wall of the trench 17 from additionally being oxidized, a silicon nitride layer, i.e., oxidation barrier layer 20 is formed on an overall surface of the resulting structure where the oxide layer 19 is formed. It is preferable that a capping layer 21, for example, CVD oxide layer for protecting the oxidation barrier layer 20, is formed on the oxidation barrier layer 20. The capping layer 21 prevents damage of the oxidation barrier layer 20 in the following process for forming an insulating layer which fills a trench. Specifically, if the trench is filled with an HDP oxide layer, the capping layer 21 protects the oxidation barrier layer 20 from etching with argon. If the trench is filled with a USG layer instead of the HDP oxide layer, on an overall surface of the above resulting structure where the trench 17 is formed, plasma treatment is carried out to improve deposition characteristic of the USG layer. In this case, the oxidation barrier layer 20 maybe damaged from plasma. The capping layer 21 prevents the damage of the oxidation barrier layer 20. The oxidation barrier layer 20 and capping layer 21 are formed to have a thickness of 20 Å~300 Å, respectively.

Figure 1F:
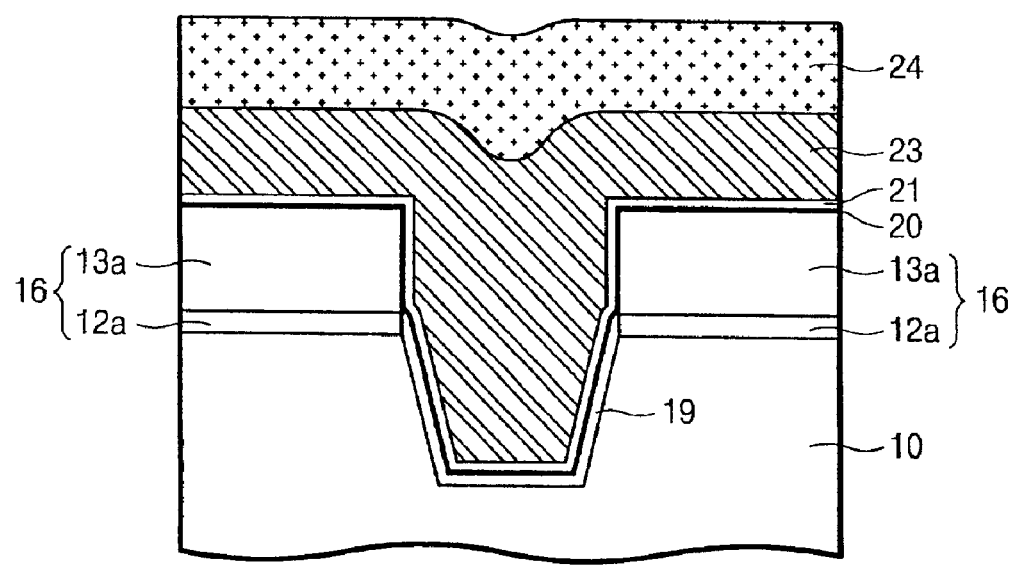

Referring to FIG. 1F, on an overall surface of the above resulting structure where the capping layer 21 is formed, an insulating layer 23 is formed to fill the trench 17. The insulating layer 23 comprises, for example, HDP oxide or USG whose gap-filling characteristics are such that the trench can be filled without void.

As a feature of the present invention, a material layer 24 is then formed on the insulating layer 23. The material layer 24 comprises a material whose planarization characteristic is such that the following polarization etching process can easily be carried out. It is preferable that the material layer 24 comprises material having stress characteristics which can reduce stress applied to the semiconductor substrate 10 by the insulating layer 23. Further, the material 24 is deposited at a temperature high enough to densify the insulating layer 23, preferably, at a temperature of 500° C. and higher. Since therefore the insulating layer 23 is densified while forming the material layer 24, a subsequent densification process can be avoided.

The material layer 24 may comprises, for example, a material selected from a group consisting of, for example, HTO, high temperature USG, polysilicon, and amorphous silicon. Specifically, the HTO layer is formed by a CVD process using $SiH_4$ gas and $O_2$ gas at a temperature of 700° C.~800° C. The high temperature USG layer is formed by a CVD process using TEOS at a temperature of about 500° C. The polysilicon layer is formed by a CVD process using $SiH_4$ gas at a temperature of 600° C.~700° C. The amorphous silicon layer is formed by a CVD process using $SiH_4$ at a temperature of 500° C.~600° C.

Figure 1G:
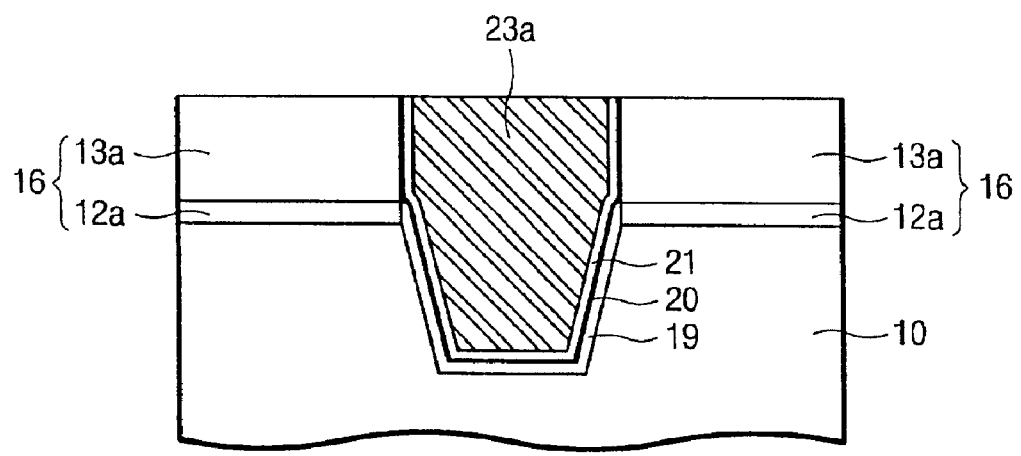

Referring to FIG. 1G, with a chemical mechanical polishing (CMP) process, the material layer 24 and the insulating layer 23 are planarly etched down to a top surface of the etching mask pattern 16. So a device isolation layer pattern 23a filling a trench is formed.

Figure 1H:
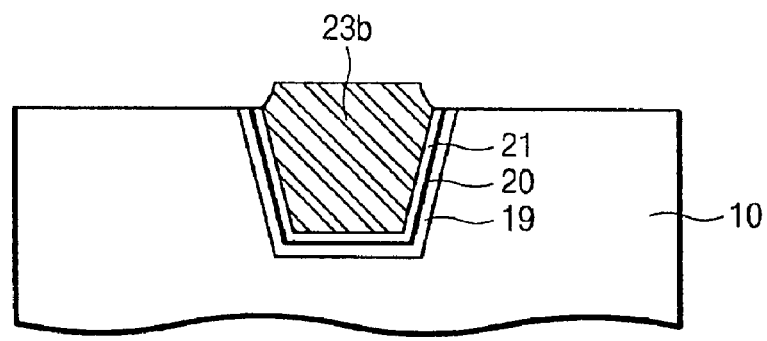

Referring to FIG. 1H, the etching mask pattern 16 is wet etched to complete a device isolation 23b. If the etch-stop layer pattern 13a is made of silicon nitride, it is etched using phosphoric acid solution. The pad oxide layer 12a is etched using fluoric acid solution.

According to the method, the trench 17 is filled with the insulating layer 23, and then the insulating layer 23 is densified while depositing the material layer 24. Thus, it is possible to form a trench isolation layer 23b having a low wet etching rate without carrying out a densification process.

Figure 2A:
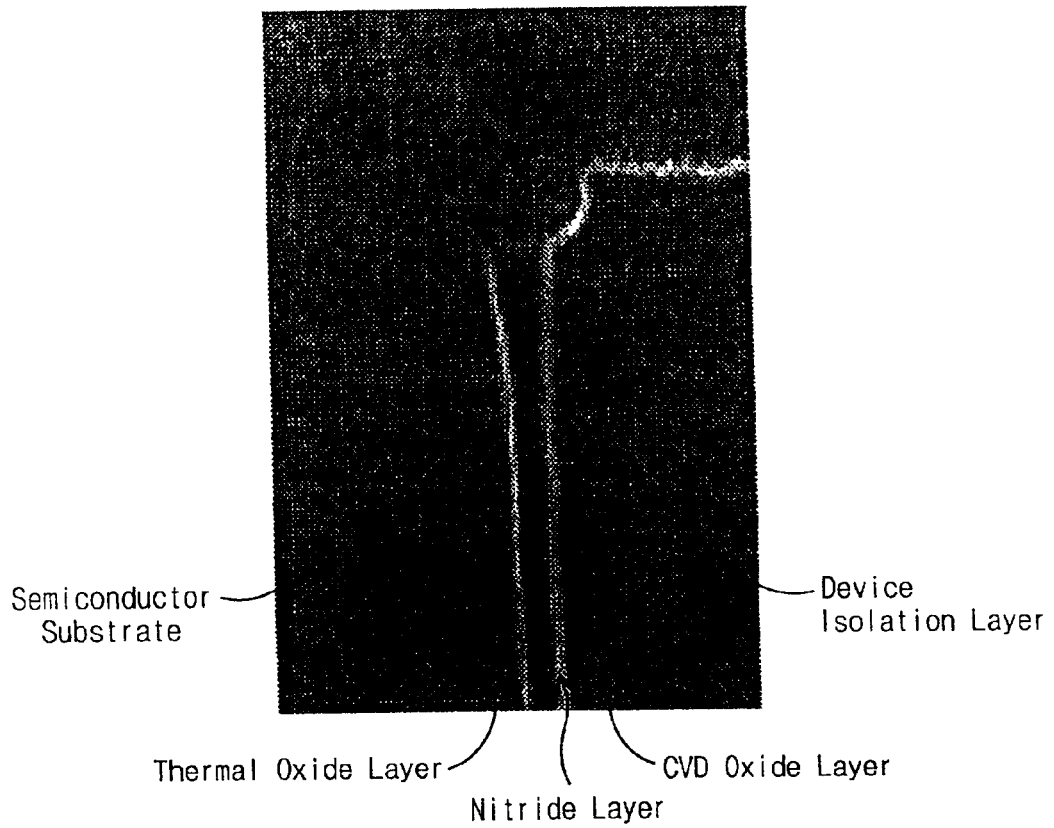
FIG. 2A and FIG. 2B are scanning electron microscope (SEM) photos showing a profile of a trench isolation layer in accordance with a prior art and the present invention, respectively.

FIG. 2A is an SEM photo showing a profile of a trench isolation layer in accordance with a prior art. A trench is formed and annealed in oxygen ambient at a temperature of 850° C., so that a thermal oxide layer grows on an inner side and a bottom of the trench to a thickness of 110 Å. With a CVD process, a nitride layer is formed on the thermal oxide layer to a thickness of 55 Å. A CVD oxide layer is formed on the nitride layer to a thickness of 100 Å. An HDP oxide layer is formed to a thickness of 5500 Å to fill the trench. A PTEOS layer is formed on the HDP oxide layer to a thickness of 2000 Å, and is annealed at a temperature of 1050° C. for an hour. Thus, a densification process is completed.

Figure 2B:
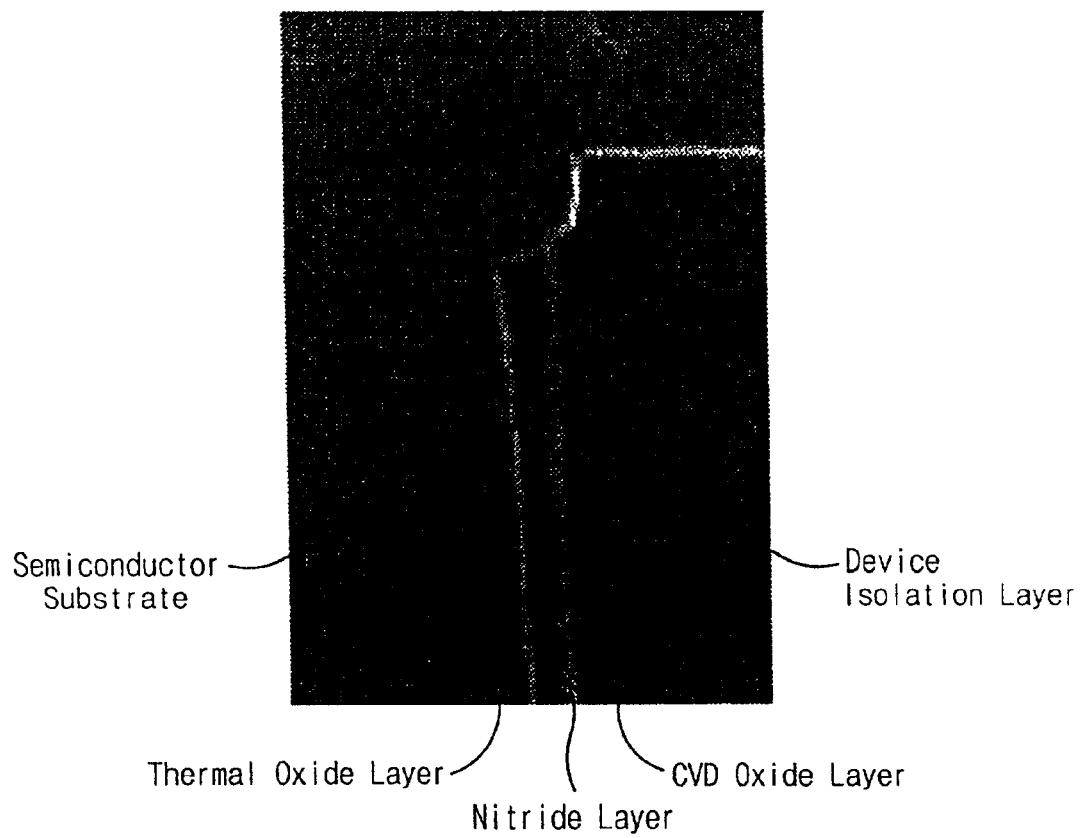

FIG. 2B is an SEM photo showing a profile of a trench isolation layer in accordance with the present invention. With a method same as described in FIG. 2A, a thermal oxide layer, a nitride layer, and a CVD oxide layer are sequentially formed on an inner wall of a trench. An HDP oxide layer is then formed to a thickness of 5500 Å to fill the trench. An HTO oxide layer is then formed on the HDP oxide layer at a temperature of 780° C.

As shown in FIG. 2A and FIG. 2B, a profile (see FIG. 2B) of a trench isolation layer which does not undergo a densification process is nearly similar to a profile (see FIG. 2A) of a trench isolation layer which undergoes the densification process. That is, although the densification process is avoided, the present invention makes it possible to suppress excessive recess of an edge of a device isolation layer.

According to the present invention, a trench is filled with an insulating layer on which a material layer formed at a high temperature is stacked. The insulating layer is densified while forming the material layer, so that the densification process is not needed. Therefore, it is possible to simplify the process and enhance productivity.

Further, the present invention avoids the need for a densification process that anneals an overall surface of a semiconductor substrate at a high temperature. Therefore, stress applied to the substrate is reduced to improve reliability of devices.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A trench isolation method for forming a semiconductor device comprising:

forming an etching mask pattern on a semiconductor substrate to expose a predetermined region of the semiconductor substrate;

etching the exposed semiconductor substrate, using the etching mask pattern as an etching mask, to form a trench;

forming an insulating layer over the trench and nearby regions, the insulating layer filling the trench;

providing a high-temperature oxide (HTO) layer on the insulating layer, the HTO layer being formed at a temperature of 700 C.–800 C. using a silane-based source gas the underlying insulating layer being densified during formation of the HTO layer;

planarly etching the HTO layer and the insulating layer down to a top surface of the etching mask pattern to form a device isolation layer pattern in the trench; and removing the exposed etching mask pattern.

2. The method of claim 1, wherein the insulating layer is selected from a group of materials consisting of high density plasma (HDP) oxide or undoped silicate glass (USG).

3. The method of claim 1, wherein forming the etching mask pattern includes:

forming a pad oxide layer on the semiconductor substrate;

forming an etch-stop layer on the pad oxide layer; and patterning the etch-stop layer and the pad oxide layer to expose the predetermined region of the substrate.

4. The method of claim 3, wherein the pad oxide layer is formed to a thickness of 20 Å~200 Å.

5. The method of claim 3, wherein the etch-stop layer comprises silicon nitride with a thickness of 500 Å~2000 Å.

6. The method of claim 3, wherein the etch-stop layer comprises a polysilicon layer and an HTO layer which are sequentially stacked.

7. The method of claim 1 further comprising, prior to forming the insulating layer:

forming an oxide layer on an inner wall and bottom of the trench; and forming an oxidation barrier layer on the oxide layer.

8. The method of claim 7, wherein the oxide layer comprises thermal oxide or chemical vapor deposition (CVD) oxide with a thickness of 20 Å~200 Å.

9. The method of claim 7, wherein the oxidation barrier layer comprises silicon nitride with a thickness of 20 Å~300 Å.

10. The method of claim 7 further comprising forming a capping layer between the oxidation barrier layer and the insulating layer.

11. The method of claim 10, wherein the capping layer is made of CVD oxide with a thickness of 20 Å~300 Å.

12. The method of claim 1 wherein the silane-based source gas comprises silane ($SiH_4$) gas.

* * * * *

UNITED STATES PATENT AND TRADEMARK OFFICE
CERTIFICATE OF CORRECTION

PATENT NO. : 6,875,670 B2
DATED : April 5, 2005
INVENTOR(S) : Han-Sin Lee et al.

It is certified that error appears in the above-identified patent and that said Letters Patent is hereby corrected as shown below:

Column 5,
Line 2, insert -- , -- after "gas".

Signed and Sealed this

Twelfth Day of July, 2005

JON W. DUDAS
*Director of the United States Patent and Trademark Office*